(12) United States Patent
Kataoka et al.

(10) Patent No.: US 7,060,364 B2
(45) Date of Patent: Jun. 13, 2006

(54) FILM CARRIER TAPE FOR MOUNTING ELECTRONIC DEVICES THEREON

(75) Inventors: Tatsuo Kataoka, Saitama (JP); Yoshikazu Akashi, Saitama (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 0 days.

(21) Appl. No.: 10/745,403

(22) Filed: Dec. 23, 2003

(65) Prior Publication Data

US 2004/0219341 A1    Nov. 4, 2004

(30) Foreign Application Priority Data

Dec. 26, 2002   (JP) .............................. 2002-377257

(51) Int. Cl.
*B32B 15/00* (2006.01)
(52) U.S. Cl. ...................... 428/615; 428/209; 428/344; 205/78; 205/205; 427/250
(58) Field of Classification Search ................ 428/209, 428/544, 306.6, 615, 344; 205/205, 78; 427/250
See application file for complete search history.

(56) References Cited

U.S. PATENT DOCUMENTS

| | | | | |
|---|---|---|---|---|
| 3,585,010 A | * | 6/1971 | Luce et al. ................. | 428/608 |
| 5,017,271 A | * | 5/1991 | Whewell et al. ............. | 205/125 |
| 5,028,513 A | * | 7/1991 | Murakami et al. ........... | 430/315 |
| 5,147,692 A | * | 9/1992 | Bengston .................... | 427/438 |
| 5,573,845 A | * | 11/1996 | Parthasarathi et al. ... | 428/306.6 |
| 5,709,957 A | * | 1/1998 | Chiang et al. .............. | 428/615 |
| 5,863,666 A | * | 1/1999 | Merchant et al. ........... | 428/544 |
| 6,242,078 B1 | * | 6/2001 | Pommer et al. ............ | 428/209 |
| 6,630,743 B1 | * | 10/2003 | Magnuson et al. ......... | 257/774 |
| 2004/0251537 A1 | * | 12/2004 | Choi .......................... | 257/701 |

* cited by examiner

*Primary Examiner*—Cathy F. Lam
(74) *Attorney, Agent, or Firm*—The Webb Law Firm, P.C.

(57) ABSTRACT

A film carrier tape for mounting electronic components or devices that excels in not only migration resistance but also adhesiveness of wiring to insulating film; and a process for producing the same. The film carrier tape for mounting electronic components or devices has seed layer comprising a zinc layer superimposed on a treated surface of insulating film and a nickel base metal layer superimposed on a surface of a zinc layer, or comprising a layer of alloy containing elemental nickel and elemental zinc in specified proportion, superimposed on a treated surface of insulating film). In the film carrier tape for mounting electronic components or devices, at least part of a region extending across a width of wiring from an edge side thereof to the treated surface of the insulating film may be continuously covered with a zinc coating layer comprising elemental zinc.

8 Claims, 5 Drawing Sheets

FILM CARRIER TAPE FOR MOUNTING ELECTRONIC DEVICES THEREON

BACKGROUND OF THE INVENTION

1. Field of the Invention

The present invention relates to a film carrier tape for mounting electronic components or devices, having a conductor wiring pattern superimposed on an insulating film (for example, TAB (Tape Automated Bonding) tape, T-BGA (Tape Ball Grid Array) tape, CSP (Chip Size Package) tape, ASIC (Application Specific Integrated Circuit) tape, COF (Chip on Film) tape, bimetal (double-sided wiring) tape, multilayer wiring tape or the like) (hereinafter referred to simply as "film carrier tape for mounting electronic components or devices"), and relates to a process for producing the same. More particularly, the present invention relates to an film carrier tape for mounting electronic components or devices, comprising an insulating film having a treated surface and a wiring composed of a seed layer superimposed on the treated surface of the insulating film and an electrodeposited copper foil layer superimposed on a surface of the seedlayer, which film carriertape excels in not only migration resistance but also adhesiveness of wiring to the insulating film, and relates to a process for producing the same.

2. Description of the Prior Art

In the field of electronic industry, use is made of printed wiring boards on which electronic components or devices, such as ICs (integrated circuits) and LSIs (large scale integrated circuits), are mounted. With respect to the current electronic equipment, as typified by, for example, cellphones, the reduction in size and weight, sophistication, reliability increase, cost reduction, etc. thereof are demanded.

As a method of mounting electronic components or devices which is suitable for realization of characteristics, such as size and weight reduction, of electronic equipment, it is common practice to mount devices on a film carrier tape for mounting electronic components or devices, such as a TAB tape. Such a film carrier tape for mounting electronic components or devices is produced by first adhering a conductive metal foil, such as a copper foil, through a resin adhesive, such as an epoxy, to an insulating film, such as a polyimide; subsequently coating a surface of this conductive metal foil with a photosensitive resin; carrying out exposure and thereafter development so as to obtain a desired wiring pattern; and with the use of exposed or unexposed portions of the resin as a masking member, etching the conductive metal foil to thereby form a wiring.

Heretofore, the use of the thus obtained triple layer flexible substrate consisting of a layer of insulating film, a layer of resin adhesive and a layer of conductive metal has been predominant because generally the process for producing the same is simple so as to enable low-cost production.

However, in accordance with the above-mentioned advance of size and weight reduction of electronic equipment, high-density mounting of electronic components or devices is demanded, and hence with respect to the wiring width of film carrier tape for mounting electronic components or devices, narrow pitch is increasingly demanded. Meeting this demand by means of the above film carrier tape for mounting electronic components or devices of triple layer flexible substrate configuration, such as a TAB tape, is becoming difficult.

Specifically, in the formation of wiring by etching the copper foil layer superimposed on an insulating film in conformity with desired wiring pattern, etching spreading toward the bottom from a photoresist mask would be effected at wiring sides with the result that the formed wiring would be likely to have a sectional configuration of trapezoid spreading toward the bottom. Thus, the wiring pitch width after etching that has been performed until ensuring electrical insulation between wires would be so large that in the use of commonly employed triple layer flexible substrate having a copper foil of, for example, about 35 μm thickness adhered thereto, there have been limits on the realization of narrow pitch of wiring.

An attempt to realize a narrow pitch of wiring by reducing the extent of wiring bottom spreading with the use of a substrate having a thinner copper foil adhered thereto would encounter problems in production technology. For example, it would be difficult to obtain, in the form of a triple layer flexible substrate, a substrate with narrow pitch of wiring whose production would be infeasible unless use is made of a copper foil of, for example, about several microns to ten-odd microns thickness.

Accordingly, in recent years, a double layer flexible substrate having a copper conductor layer directly formed on an insulating film through a procedure of, for example, providing an insulating film with a thin copper electroplating has been developed and brought to practical use.

This double layer flexible substrate is generally produced through a procedure of providing an insulating film with a copper electroplating. For forming an electrodeposited copper foil layer through copper electroplating, it is common practice to perform pretreatments comprising treating a surface of insulating film, for example, roughening the surface by exposure to plasma and thereafter forming a thin undercoating metal layer (seed layer) on the surface. The surface of the seed layer is subjected to copper electroplating.

Specifically, first, a surface of insulating film constituted of, for example, a polyimide is treated with plasma so as to roughen the same according to, for example, known inverse sputtering. A seed layer is formed on the roughened surface by metallizing the same by vapor deposition according to, for example, sputtering. Thereafter, an electrodeposited copper foil layer of about 8 μm thickness is formed on a surface of the seed layer by copper electroplating, thereby obtaining a double layer flexible substrate. As the metal for constituting the seed layer, use is made of, for example, nickel or a nickel base alloy, such as a nickel-copper alloy, a nickel-chromium alloy or a nickel-copper-chromium alloy (see, for example, Published Japanese Translation of PCT Patent Applications from Other States, No. 2000-508265).

This double layer flexible substrate is used as, for example, a COF (Chip on Film) tape, and enables obtaining a wiring of narrow pitch, for example, pitch width of 30 μm.

In the actual use of double layer flexible substrates, as mentioned above, having devices mounted thereon, there has surfaced such a problem that upon application of voltage to copper wiring circuits, the copper would be ionized and slowly dissolved out, resulting in connection of neighboring circuits by the copper, namely, short-circuiting, known as "migration", thereby becoming a cause of damaging of the reliability of electronic components or devices.

Figure 6:
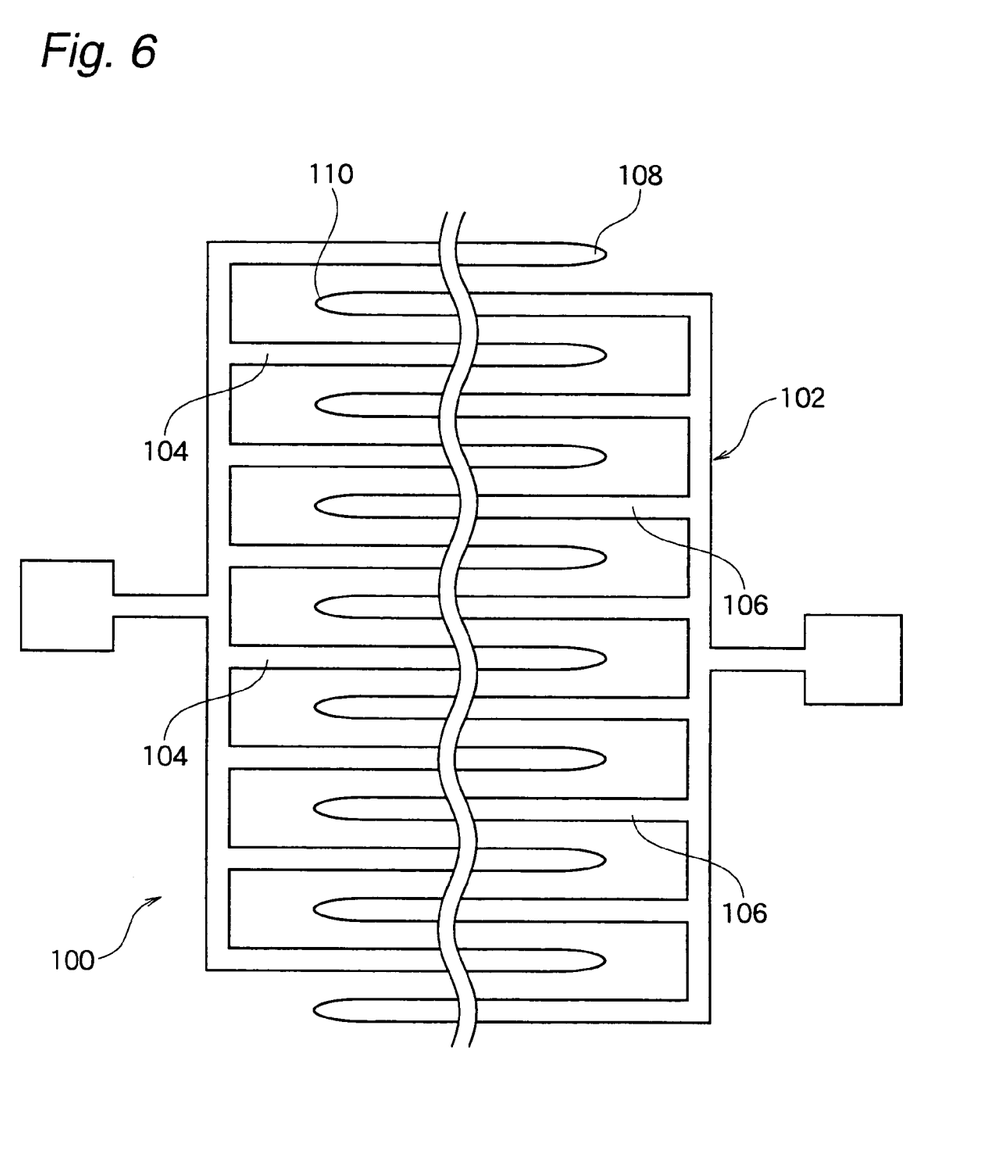
FIG. 6 is a diagrammatic view schematically showing a wiring pattern for migration evaluation.

For the reliability test evaluating the degree of this migration, there is commonly employed a method wherein referring to FIG. 6, voltage is applied to wiring pattern 102 of evaluation substrate 100 consisting of an insulating film and, superimposed thereon, comb-shaped wiring pattern 102 for evaluation, followed by measuring of the insulation of pattern circuits. In FIG. 6, among the comb-shaped opposite-arranged 16 wires of pattern circuit 102, 8 wires constitute positive electrodes 104 while the rest of 8 wires constitute negative electrodes 106. With respect to these, the inter-wire pitch width is 50 μm, and the distance between positive electrode wire end 108 and negative electrode wire end 110 is 10 mm. At constant temperature and humidity, for example, 85° C. and 85% RH, voltage of DC 60 V is applied to a circuit consisting of the pattern circuit 102 having a resistor of 100 kΩ connected in series thereto, and the voltage applied to the resistor of 100 kΩ is measured. The insulation resistance of the pattern circuit 102 is calculated from the measurement, and the change of insulation resistance value with time is evaluated.

Now, pattern circuit 102 for evaluation is prepared from a double layer flexible substrate comprising an insulating film and, directly superimposed thereon, a conductor layer and subjected to this migration evaluation test. Specifically, a seed layer of, for example, a nickel-copper alloy is formed on the treated surface of insulating film, and a copper layer is formed on a surface of the seed layer by copper electroplating. Thereafter, resist coating, hardening, exposure and etching are carried out so as to form a comb-shaped pattern. The comb-shaped pattern is treated by electroless tin plating, thereby obtaining pattern circuit 102 for evaluation. Migration evaluation of this pattern circuit 102 is performed under the above-mentioned conditions. In the migration evaluation, for example, at the passage of about 100 to 300 hr, the insulation resistance of the evaluation pattern would markedly drop to result in short-circuiting.

On the other hand, it is demanded for the seed layer to increase the adhesiveness of conductor wiring to insulating film. Thus, a technology for suppressing the above migration without detriment to this adhesiveness is demanded.

The present invention has been made with a view toward solving the above problems of the prior art. Accordingly, it is an object of the present invention to provide a film carrier tape for mounting electronic components or devices that excels in not only migration resistance but also adhesiveness of wiring to insulating film and to provide a process for producing the same.

SUMMARY OF THE INVENTION

For attaining the above object, in one aspect of the present invention, there is provided a film carrier tape for mounting electronic components or devices, comprising:

an insulating film having a treated surface; and a wiring composed of a seed layer superimposed on the treated surface of the insulating film and a copper layer superimposed on a surface of the seed layer;

wherein the seed layer comprises:

a zinc layer of 10 to 300 angstroms thickness consisting essentially of elemental zinc, superimposed on the treated surface of the insulating film; and a nickel base metal layer of 30 to 500 angstroms thickness consisting of a nickel base metal, superimposed on a surface of the zinc layer.

In this film carrier tape for mounting electronic components or devices, the seed layer is preferably one formed by vapor deposition.

In another aspect of the present invention, there is provided a film carrier tape for mounting electronic components or devices, comprising:

an insulating film having a treated surface; and a wiring composed of a seed layer superimposed on the treated surface of the insulating film and a copper layer superimposed on a surface of the seed layer;

wherein the seed layer comprises an alloy layer superimposed on the treated surface of the insulating film, the alloy layer composed of 70 to 99 mass % of nickel base metal and 1 to 30 mass % of elemental zinc.

In this film carrier tape for mounting electronic components or devices, the seed layer preferably comprises an alloy layer superimposed on the treated surface of the insulating film, the alloy layer composed of 50 to 95 mass % of elemental nickel, 4 to 20 mass % of elemental chromium and 1 to 30 mass % of elemental zinc.

Moreover, it is preferred that the seed layer be one formed by vapor deposition.

In a further aspect of the present invention, there is provided a film carrier tape for mounting electronic components or devices, comprising:

an insulating film having a treated surface; and a wiring composed of a seed layer superimposed on the treated surface of the insulating film and a copper layer superimposed on a surface of the seed layer;

wherein at least part of a region extending across a width of wiring from an edge side thereof to the treated surface of the insulating film is continuously covered with a zinc coating layer comprising elemental zinc.

In this film carrier tape for mounting electronic components or devices, the zinc coating layer is preferably one formed by zinc electroplating.

In still a further aspect of the present invention, there is provided a process for producing a film carrier tape for mounting electronic components or devices, comprising:

an insulating film having a treated surface, and a wiring composed of a seed layer superimposed on the treated surface of the insulating film and a copper layer superimposed on a surface of the seed layer, which process comprises:

a surface treatment step of treating a surface of an insulating film;

a seed layer forming step comprising coating the treated surface of the insulating film with a zinc layer of 10 to 300 angstroms thickness by vapor deposition of elemental zinc and thereafter coating a surface of the zinc layer with a nickel base metal layer of 30 to 500 angstroms thickness by vapor deposition of a nickel base metal; and a copper layer forming step of coating a surface of the seed layer with an electrodeposited copper foil layer by copper electroplating.

In even still a further aspect of the present invention, there is provided a process for producing a film carrier tape for mounting electronic components or devices, comprising:

an insulating film having a treated surface, and a wiring composed of a seed layer superimposed on the treated surface of the insulating film and a copper layer superimposed on a surface of the seed layer, which process comprises:

a surface treatment step of treating a surface of an insulating film;

a seed layer forming step comprising coating the treated surface of the insulating film with an alloy layer composed of 70 to 99 mass % of nickel base metal and 1 to 30 mass % of elemental zinc by vapor deposition of an alloy comprising elemental nickel and elemental zinc; and a copper layer forming step of coating a surface of the seed layer with an electrodeposited copper foil layer by copper electroplating.

In the seed layer forming step of this process, preferably, the treated surface of the insulating film is coated with an alloy layer composed of 50 to 95 mass % of elemental nickel, 4 to 20 mass % of elemental chromium and 1 to 30 mass % of elemental zinc by vapor deposition of an alloy comprising elemental chromium.

In yet even still a further aspect of the present invention, there is provided a process for producing a film carrier tape for mounting electronic components or devices, comprising:

an insulating film having a treated surface, and a wiring composed of a seed layer superimposed on the treated surface of the insulating film and a copper layer superimposed on a surface of the seed layer, which process comprises a step of forming a zinc coating layer by zinc electroplating so that at least part of a region extending across a width of wiring from an edge side thereof to the treated surface of the insulating film is continuously covered with a zinc coating layer comprising elemental zinc.

EFFECT OF THE INVENTION

The film carrier tape for mounting electronic components or devices according to the present invention excels in not only migration resistance but also adhesiveness of wiring to insulating film.

The film carrier tape for mounting electronic components or devices that excels in not only migration resistance but also adhesiveness of wiring to insulating film can be produced by the process for producing a film carrier tape for mounting electronic components or devices according to the present invention.

DETAILED DESCRIPTION OF THE INVENTION

Embodiments of the present invention will be described in detail below with reference to the appended drawings. FIGS. 1 to 4 are each a view of partial section taken in the direction perpendicular to tape surface which schematically shows a film carrier tape for mounting electronic components or devices according to an embodiment of the present invention. FIG. 5 is a partial top view schematically showing a film carrier tape for mounting electronic components or devices according to an embodiment of the present invention.

Figure 1:
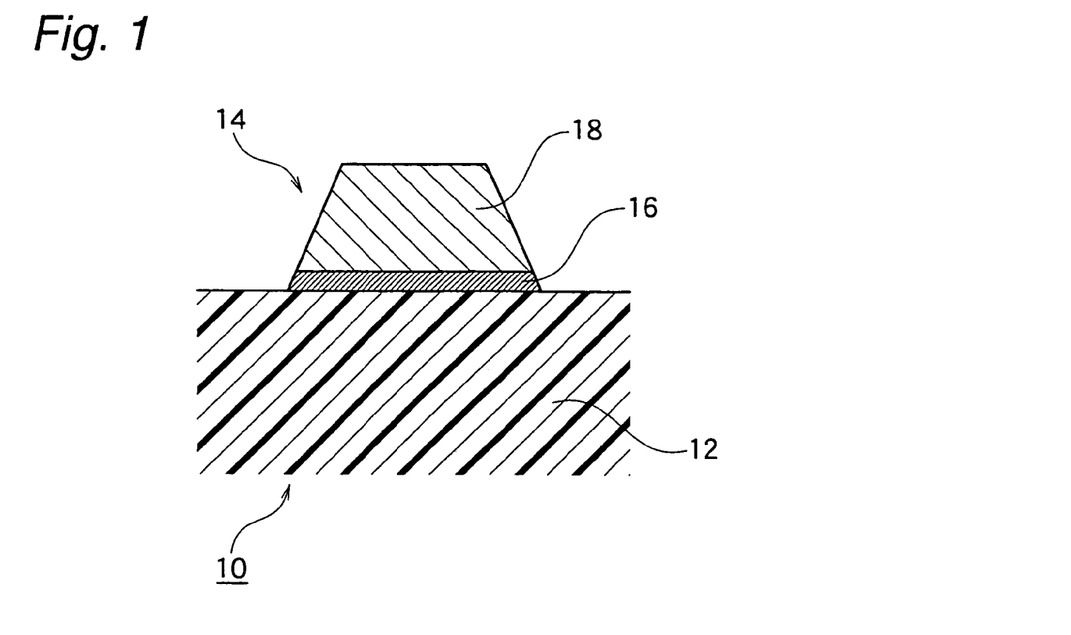
FIG. 1 is a partial sectional view taken in a direction perpendicular to the tape surface which schematically shows a film carrier tape for mounting electronic components or devices according to one embodiment of the present invention.

For example, referring to FIG. 1, the film carrier tape for mounting electronic components or devices (10) according to the present invention comprises insulating film (12) and wiring (14) superimposed on a surface of the insulating film (12).

The characteristics of the present invention reside in that an elemental zinc of specified makeup is contained in a region adjacent to the copper layer, for example, electrodeposited copper foil layer (18) of the wiring (14) and to the insulating film (12). This enables preventing the migration of electrodeposited copper with high effectiveness. The anticorrosive action of zinc is considered as a cause thereof. Specifically, that the elemental zinc acts as a sacrificial anode to the electrodeposited copper and prevents the ionization of copper would be associated with the fact that striking migration resistance effect can be attained by the specific use of zinc among a multiplicity of metal species. However, naturally, the interpretation of the present invention should not be restricted to this cause.

Figure 2:
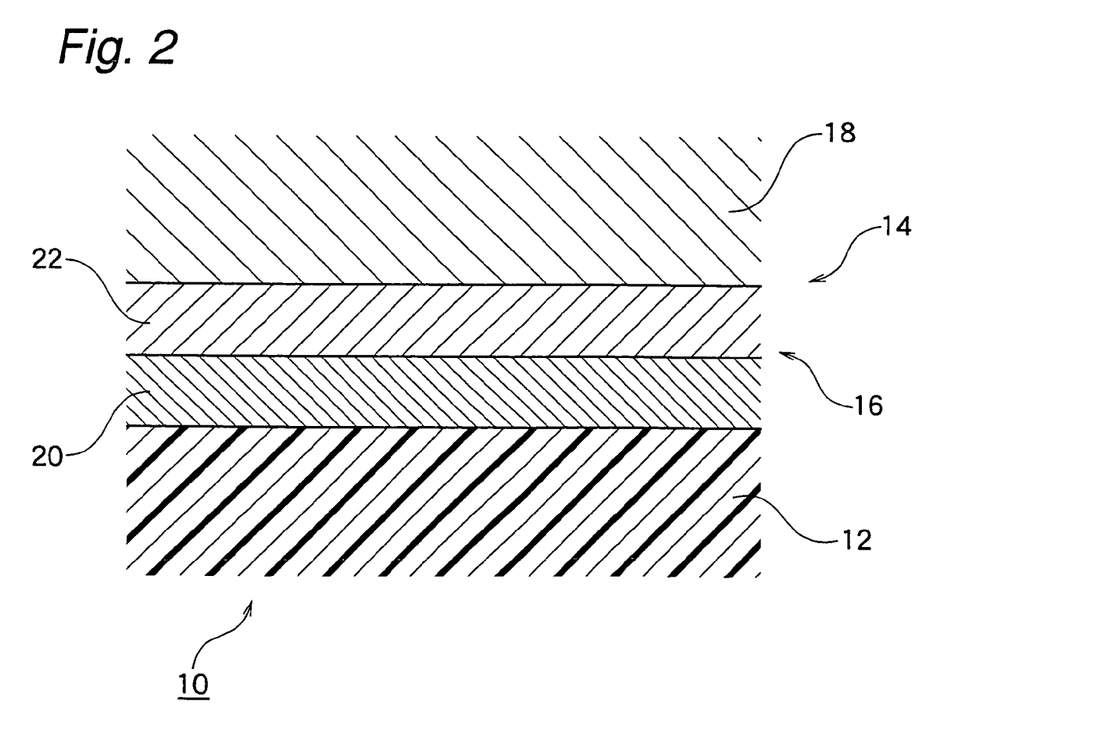
FIG. 2 is a partial sectional view taken in a direction perpendicular to the tape surface which schematically shows a film carrier tape for mounting electronic components or devices according to another embodiment of the present invention.

The first characteristic of the present invention, referring to FIG. 2, resides in disposing seed layer (16) comprising zinc layer (20) of specified thickness consisting essentially of elemental zinc, superimposed on the treated surface of insulating film (12), and nickel base metal layer (22) of specified thickness consisting of a nickel base metal, superimposed on a surface of the zinc layer (20).

The thickness of the zinc layer (20) is in the range of 10 to 300 angstroms, preferably 20 to 200 angstroms. When the layer thickness is smaller than this range, the migration resistance would not be satisfactory. On the other hand, when the layer thickness is larger than this range, the adhesiveness of wiring (14) to insulating film (12) would not be satisfactory.

The zinc layer (20) is adhered to the treated surface of the insulating film (12) by common vapor deposition techniques, such as sputtering. As non-sputtering vapor deposition techniques, there can be mentioned, for example, the thermal evaporation, electron beam evaporation, induction evaporation, resistive evaporation, ion plating, plasma activated evaporation, reactive evaporation, activated reactive evaporation and other physical vapor deposition techniques as well as chemical vapor deposition techniques.

As the method of treating the surface of insulating film (12), there can be mentioned, for example, one wherein plasma treatment by inverse sputtering is performed so as to roughen the surface of insulating film (12). The surface treatment may be performed by other common plasma treatment methods, chemical treatment methods using chemical agents, etc., as long as appropriate physical surface roughening or chemical surface modification treatment for increasing the strength of adhesiveness of wiring (14) to insulating film (12) can be effected.

A polyimide film is especially preferred as the insulating film (12). For example, use can be made of Kapton (trade name, produced by Du Pont Toray Co., Ltd.), Upilex (trade name, produced by Ube Industries, Ltd.) or Apical (trade name, produced by Kaneka Corporation). The thickness of the insulating film (12) is generally in the range of 25 to 125 µm.

The thickness of the nickel base metal layer (22) is in the range of 30 to 500 angstroms, preferably 50 to 300 angstroms. When the layer thickness is smaller than this range, the adhesiveness of wiring (14) to insulating film (12) would not be satisfactory. On the other hand, when the layer thickness is larger than this range, performing of appropriate etching might be infeasible.

The nickel base metal for constituting the nickel base metal layer (22) may be not only elemental nickel but also a nickel alloy containing 0 to 30 mass % of a non-nickel metal, such as copper, chromium, molybdenum or tantalum.

This nickel base metal is adhered to the surface of the zinc layer (20) by the above vapor deposition techniques, thereby forming the nickel base metal layer (22).

If desired, a vapor deposited copper layer of 100 to 6000 angstroms thickness (not shown) may be superimposed as part of the seed layer (16) on the surface of nickel base metal layer (22) on the side of electrodeposited copper foil layer (18). This vapor deposited copper layer is formed by the above vapor deposition techniques.

The surface of the seed layer (16) is coated with a 6 to 12 μm thick copper layer, for example, electrodeposited copper foil layer (18). The electrodeposited copper foil layer (18) is formed by electroplating the surface of seed layer (16) with copper through immersion of the insulating film (12) furnished with the seed layer (16) in, for example, a copper sulfate plating bath.

Figure 3:
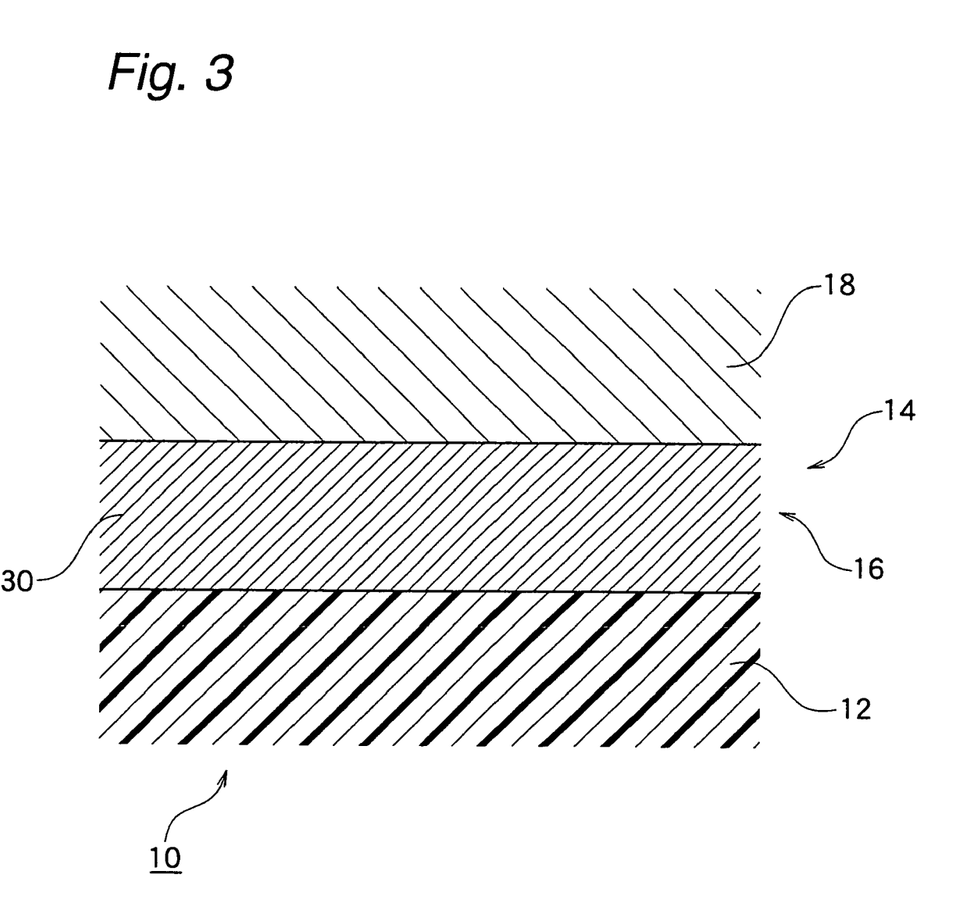
FIG. 3 is a partial sectional view taken in a direction perpendicular to the tape surface which schematically shows a film carrier tape for mounting electronic components or devices according to a further embodiment of the present invention.

The second characteristic of the present invention, referring to FIG. 3, resides in disposing seed layer (16) comprising alloy layer (30) on the surface of the insulating film (12), the alloy comprising elemental nickel and elemental zinc in specified mass ratio.

This alloy layer may be composed of 70 to 99 mass % of nickel base metal and 1 to 30 mass % of elemental zinc. When the ratio of elemental zinc in the alloy is smaller than this range, the migration resistance would not be satisfactory. On the other hand, when the ratio of elemental zinc in the alloy is larger than this range, the adhesiveness of wiring (14) to insulating film (12) would not be satisfactory.

The above nickel base metal may be composed of, based on the total amount of alloy constituting the alloy layer, 50 to 99 mass % of elemental nickel and 0 to 20 mass % of elemental metal other than zinc, such as copper, chromium, molybdenum or tantalum. From the viewpoint mentioned above, it is preferred that the alloy layer be composed of 70 to 99 mass % of elemental nickel and 1 to 30 mass % of elemental zinc, or composed of 50 to 95 mass % of elemental nickel, 4 to 20 mass % of elemental chromium and 1 to 30 mass % of elemental zinc.

The thickness of the alloy layer (30) is preferably in the range of 20 to 250 angstroms, still preferably 50 to 200 angstroms. When the layer thickness is smaller than this range, the migration resistance might not be satisfactory. On the other hand, when the layer thickness is larger than this range, the adhesiveness of wiring (14) to insulating film (12) might not be satisfactory.

If desired, a vapor deposited copper layer of 100 to 6000 angstroms thickness (not shown) may be superimposed as part of the seed layer (16) on the surface of alloy layer (30) on the side of electrodeposited copper foil layer (18). This vapor deposited copper layer is formed by the above vapor deposition techniques.

The surface of the seed layer (16) is coated with a 6 to 12 μm thick copper layer, for example, electrodeposited copper foil layer (18). The electrodeposited copper foil layer (18) is formed by electroplating the surface of seed layer (16) with copper through immersion of the insulating film (12) furnished with the seed layer (16) in, for example, a copper sulfate plating bath.

Now, the process for producing the above film carrier tape for mounting electronic components or devices according to the present invention will be described. First, the surface of insulating film (12) is treated in the aforementioned manner. Subsequently, the above seed layer (16) is formed over the treated surface of the insulating film (12) by vapor deposition. For example, in the formation of seed layer (16) composed of zinc layer (20) and nickel base metal layer (22), the zinc layer (20) is first formed by carrying out vapor deposition of elemental zinc over the treated surface of insulating film (12), and subsequently the nickel base metal layer (22) is formed by carrying out vapor deposition of a nickel base metal over the surface of the zinc layer (20). Further, for example, in the formation of seed layer (16) constituted of alloy layer (30), the alloy layer (30) is formed-by carrying out vapor deposition of an alloy comprising elemental nickel and elemental zinc over the treated surface of insulating film (12).

Thereafter, electrodeposited copper foil layer (18) is formed over the entire surface of seed layer (16) by copper electroplating.

Thus, a double layer flexible substrate having a conductor layer superimposed on the insulating film (12) is obtained. According to customary procedure, this double layer flexible substrate has its surface of electrodeposited copper foil layer (18) coated with a photoresist and dried, and is subjected to the steps of exposure, development, etching and photoresist stripping so as to form a pattern of wiring (14). As a result, the film carrier tape for mounting electronic components or devices (10) according to the present invention as shown in FIG. 5 is obtained.

A thermosetting resin (solder resist) of relatively high viscosity for protecting the wiring (14) is applied to the film carrier tape for mounting electronic components or devices (10) by the use of screen printing technique and hardened. Thereafter, both longitudinal ends of wiring (14) exposed from solder resist application region (56) are coated with tin by, for example, electroless tin plating, thereby obtaining a circuit board. Sprocket holes (58) are provided for the transport or positioning of film carrier tape for mounting electronic components or devices (10).

Figure 4:
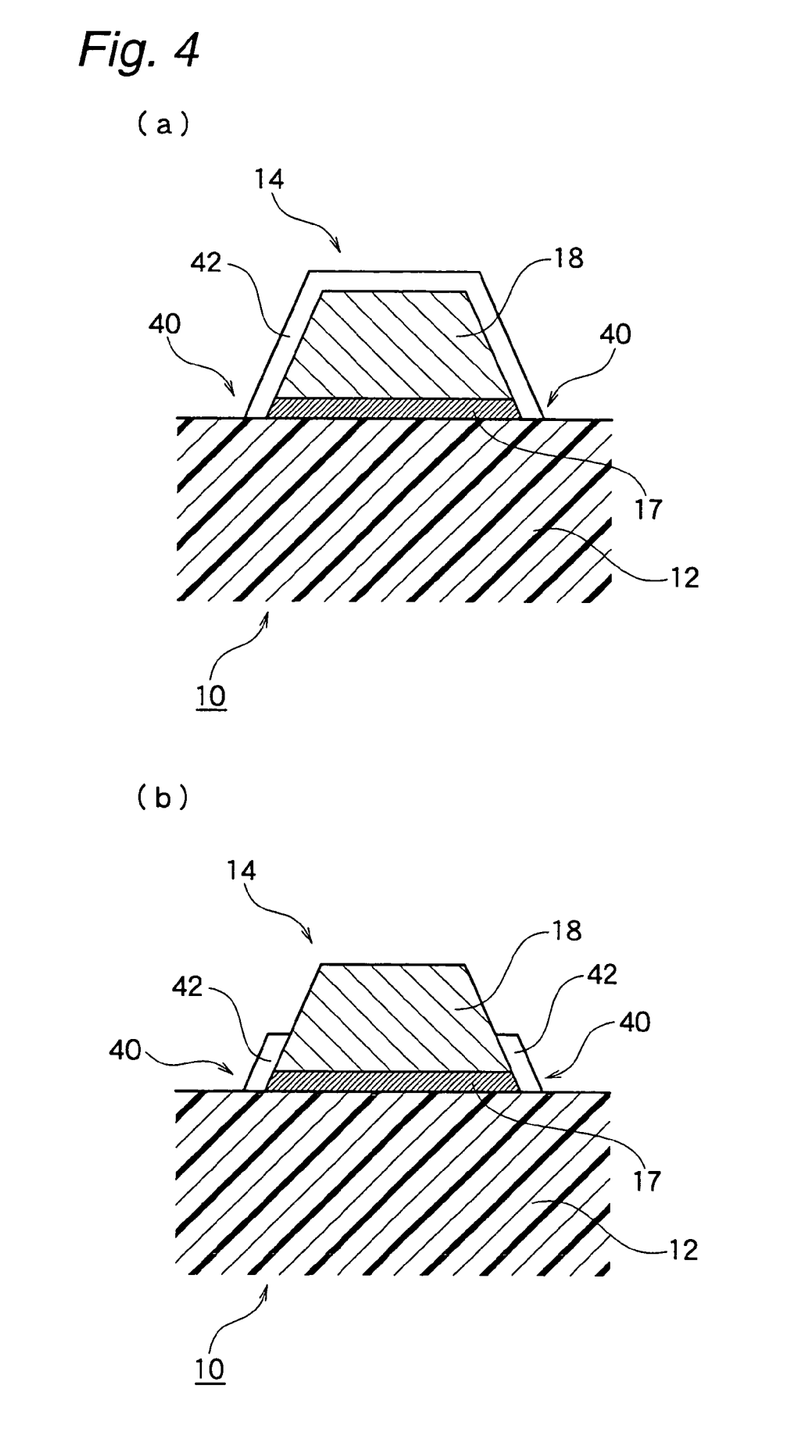
FIG. 4 is a partial sectional view taken in a direction perpendicular to the tape surface which schematically shows a film carrier tape for mounting electronic components or devices according to still a further embodiment of the present invention.
Figure 5:
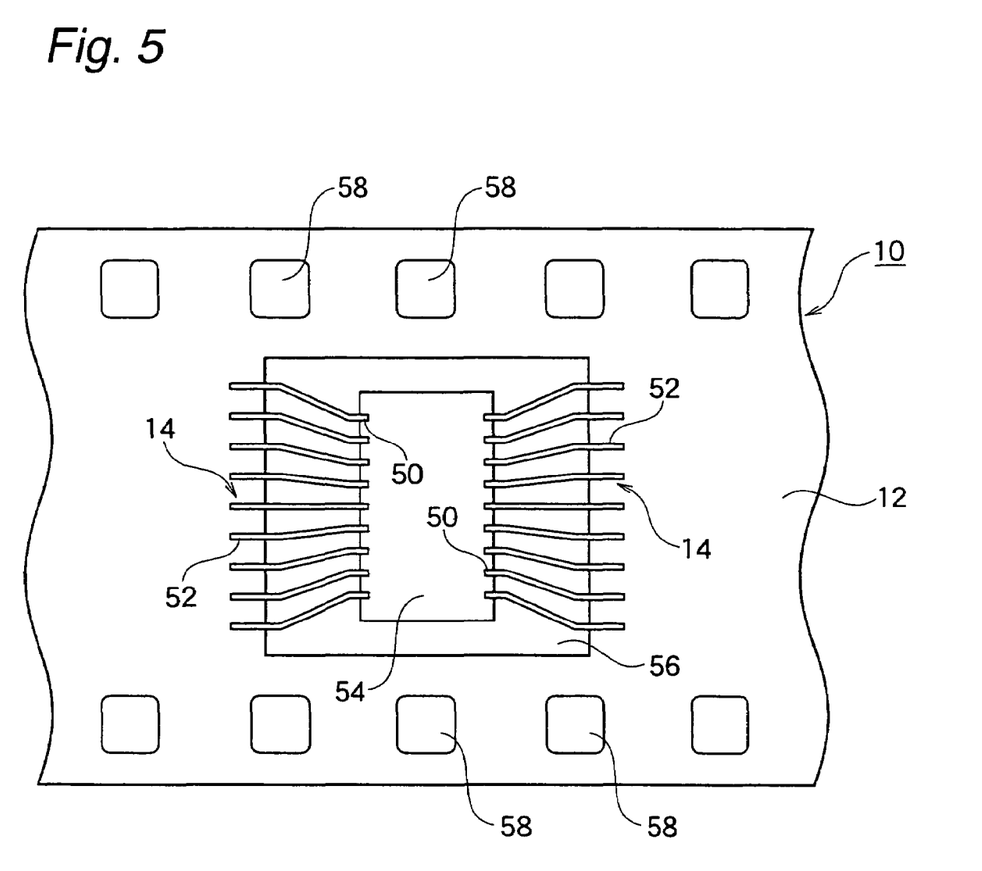
FIG. 5 is a partial top plan view schematically showing a film carrier tape for mounting electronic components or devices according to an embodiment of the present invention.

The third characteristic of the present invention, referring to FIG. 4, resides in that with respect to wiring (14) composed of seed layer (17) superimposed on a treated surface of insulating film (12) and a copper layer, for example, electrodeposited copper foil layer (18) superimposed on a surface of the seed layer (17), at least part of a region extending across a width of the wiring from an edge side thereof to the treated surface of the insulating film (12) is continuously covered with zinc coating layer (42) comprising elemental zinc.

The zinc coating layer (42) may be continuously formed across the width from one edge side (40) to the opposite edge side (40) so as to cover the entire surface of wiring (14) as shown in FIG. 4(a), or may be formed only around the both edge sides (40, 40) as shown in FIG. 4(b). However, since copper ions which are the cause of inducing migration move from an edge side of wiring (14) to the surface of the insulating film (12), it is requisite that continuous coating be effected from an edge side surface of wiring (14) through part of the surface of insulating film (12) (surface zone lying in the vicinity of edge side (40) of wiring (14)). This enables preventing the migration of electrodeposited copper with striking effectiveness.

The thickness of the zinc coating layer (42) is preferably in the range of 20 to 250 angstroms. When the layer thickness is smaller than this range, the migration resistance might not be satisfactory. Since satisfactory migration resistance can be attained without the need to further increase the layer thickness, it is not necessary to further increase the layer thickness.

The zinc coating layer (42) is preferably constituted substantially of elemental zinc. It is preferably formed by zinc electroplating. For example, the zinc coating layer (42) is formed by immersing the insulating film (12) furnished with wiring (14) in a zinc electroplating bath and effecting electrodeposition of zinc. As the zinc electroplating bath, use is made of, for example, an acid aqueous ammonium solution containing zinc chloride and ammonium chloride and having its pH value appropriately adjusted. The thickness, etc. of the zinc coating layer (42) can be appropriately regulated through electrolytic time, etc.

The seed layer (17), although preferably consisting of a vapor deposition layer comprising nickel, is not particularly limited, and may be the above seed layer (16) comprising zinc as illustrated in FIGS. 2 and 3.

Now, the process for producing the above film carrier tape for mounting electronic components or devices according to the present invention will be described. First, the surface of insulating film (12) is treated in the aforementioned manner. Subsequently, seed layer (17) is formed over the treated surface of the insulating film (12) by vapor deposition.

Subsequently, electrodeposited copper foil layer (18) is formed over the entire surface of seed layer (17) by copper electroplating.

Thus, a double layer flexible substrate having a conductor layer superimposed on the insulating film (12) is obtained. According to customary procedure, this double layer flexible substrate has its surface of electrodeposited copper foil layer (18) coated with a photoresist and dried, and is subjected to the steps of exposure, development, etching and photoresist stripping so as to form a pattern of wiring (14).

Thereafter, zinc coating layer (42) is formed on the surface of wiring (14) by zinc electroplating. As a result, the film carrier tape for mounting electronic components or devices (10) according to the present invention as shown in FIG. 5 is obtained.

A thermosetting resin (solder resist) of relatively high viscosity for protecting the wiring (14) is applied to the film carrier tape for mounting electronic components or devices (10) by the use of screen printing technique and hardened. Thereafter, both longitudinal ends of wiring (14) exposed from solder resist application region (56) are coated with tin by, for example, electroless tin plating, thereby obtaining a circuit board. One end of the tin plated wiring (14) constitutes inner lead (50) for electrical connection with a device, such as an IC, and the opposite end thereof constitutes outer lead (52) for electrical connection with exterior. The inner lead (50) is united to a bump electrode provided on a device, such as an IC, mounted on mounting site (54) by thermocompression bonding with the use of heating bonding tool or the like, so that the tin from the tin plating layer provided on the surface of inner lead (50) and the gold constituting the bump electrode form a eutectic alloy to thereby accomplish connection between the inner electrode (50) and the bump electrode.

EXAMPLE

The present invention will be further illustrated below with reference to the following Examples, which however in no way limit the scope of the invention.

Surface of 125 μm thick polyimide film (trade name: Kapton, produced by Du Pont Toray Co., Ltd.) was treated by inverse sputtering. The treated surface was coated with elemental zinc by sputtering, thereby forming a zinc layer of 100 angstroms thickness in Example 1 and a zinc layer of 200 angstroms thickness in Example 2. Subsequently, the surface of the zinc layer was coated with nickel by sputtering, thereby forming a nickel layer of 300 angstroms thickness. Thereafter, the surface of the nickel layer was coated with copper by sputtering, thereby forming a copper layer of 5000 angstroms thickness. After the formation of seed layer in the above manner, electroplating was carried out in a copper sulfate plating bath, thereby forming an 8 μm thick electrodeposited copper foil layer on the surface of the seed layer. Thus, a double layer flexible substrate was obtained.

In Example 3, a surface of 125 μm thick polyimide film (trade name: Kapton, produced by Du Pont Toray Co., Ltd.) was treated by inverse sputtering. The polyimide surface was coated with a Ni—Cr—Zn alloy by sputtering, thereby forming an alloy layer. Subsequently, a copper layer of 5000 angstroms thickness was formed thereon by sputtering. After the formation of seed layer in the above manner, electroplating was carried out in a copper sulfate plating bath, thereby forming an 8 μm thick electrodeposited copper foil layer on the surface of the seed layer. Thus, a double layer flexible substrate was obtained. The composition of Ni—Cr—Zn alloy mentioned above consisted of 79 mass % of elemental nickel, 20 mass % of elemental chromium and 1 mass % of elemental zinc.

The thus obtained double layer flexible substrate was slit into a 35 mm width long tape. The surface of electrodeposited copper foil layer thereof was coated with photoresist (trade name: FR-200, produced by Shipley Far East Ltd.), dried, exposed to UV through a glass photomask provided with a 50 μm pitch comb-shaped electrode pattern of configuration shown in FIG. 6, and developed with alkali (KOH). Thereafter, etching thereof was carried out at 40° C. and at a spray pressure of 2 kg/cm$^2$ with the use of an etching line of cupric chloride containing HCl and $H_2O_2$, and the photoresist was stripped off. Thus, a 50 μm pitch comb-shaped electrode pattern shown in FIG. 6 was obtained. The substrate surface was pickled, and plated at 70° C. for 1 min 55 sec in electroless tin plating bath (trade name: LT-34, produced by Shipley Far East Ltd.), thereby forming a 0.4 μm thick tin plating layer. Annealing thereof was performed at 125° C. for 1 hr. Thus, a circuit board for migration evaluation was obtained.

Surface of 125 μm thick polyimide film (trade name: Kapton, produced by Du Pont Toray Co., Ltd) was treated by inverse sputtering. The treated surface was coated with an alloy consisting of 10 mass % of elemental zinc, 80 mass % of elemental nickel and 10mass % of elemental copper by sputtering, thereby forming an alloy layer of 150 angstroms thickness. After the formation of seed layer in the above manner, electroplating was carried out in a copper sulfate plating bath, thereby forming an 8 μm thick electrodeposited copper foil layer on the surface of the seed layer. Thus, a double layer flexible substrate was obtained.

The thus obtained double layer flexible substrate was slit into a 35 mm width long tape. The surface of electrodeposited copper foil layer thereof was coated with photoresist (trade name: FR-200, produced by Shipley Far East Ltd.), dried, exposed to UV through a glass photomask provided with a 50 μm pitch comb-shaped electrode pattern of configuration shown in FIG. 6, and developed with alkali (KOH). Thereafter, etching thereof was carried out at 40° C. and at a spray pressure of 2 kg/cm$^2$ with the use of an etching line of cupric chloride containing HCl and $H_2O_2$, and the photoresist was stripped off. Thus, a 50 μm pitch comb-shaped electrode pattern shown in FIG. 6 was obtained. The substrate surface was pickled, and plated at 70° C. for 2 min 45 sec in electroless tin plating bath (trade name: LT-34, produced by Shipley Far East Ltd.), thereby forming a 0.5 μm thick tin plating layer. Annealing thereof was performed at 125° C. for 1 hr. Thus, a circuit board for migration evaluation was obtained.

A circuit board for migration evaluation was produced in the same manner as in Example 1 except that the zinc layer was not provided.

A direct current voltage of 60 V was applied to each of the circuit boards for migration evaluation obtained in Examples 1 to 4 and Comparative Example 1, and migration evaluation was performed while maintaining the circuit boards formigration evaluation at 85° C. and 85% RH in constant temperature and humidity chamber (trade name: FX412P type, manufactured by ETAC). The migration evaluation was effected on the basis of insulation resistance calculated every 5 minutes under the voltage load. The changes with time of insulation resistance values are listed in Table 1.

TABLE 1

| Voltage loading time | 0 hr | 500 hr | 1000 hr |
|---|---|---|---|
| Example 1 | $1 \times 10^8$ Ω | $1.2 \times 10^9$ Ω | $5 \times 10^9$ Ω |
| Example 2 | $1 \times 10^9$ Ω | $9 \times 10^9$ Ω | $1 \times 10^{10}$ Ω |
| Example 3 | $1 \times 10^9$ Ω | $1.8 \times 10^9$ Ω | $7 \times 10^9$ Ω |
| Example 4 | $1 \times 10^9$ Ω | $1.5 \times 10^9$ Ω | $1.2 \times 10^{10}$ Ω |
| Comp. Ex. 1 | $7 \times 10^8$ Ω | $7 \times 10^7$ Ω | $4 \times 10^7$ Ω |

It is apparent from Table 1 that the circuit boards for migration evaluation of Examples 1 and 2 having the seed layer composed of the zinc layer of 100 angstroms or 200 angstroms thickness and the nickel layer of 300 angstroms thickness, the circuit board for migration evaluation of Example 3 having the seed layer constituted of the alloy layer consisting of 79 mass % of elemental nickel, 20 mass % of elemental chromium and 1 mass % of elemental zinc and the circuit board for migration evaluation of Example 4 having the seed layer constituted of the alloy layer consisting of 10 mass % of elemental zinc, 80 mass % of elemental nickel and 10 mass % of elemental copper all retain the insulation resistance even after the passage of 1000 hr, maintaining desirable insulation condition.

By contrast, in Comparative Example 1 wherein the seed layer does not contain zinc, the insulation resistance drops at the passage of 500 hr, attesting to the occurrence of migration.

As apparent from these, the employment of the seed layer of the construction of the present invention enables extremely prolonging the time to migration occurrence and hence enables obtaining the film carrier tape for mounting electronic components or devices of excellent migration resistance.

Surface of 125 μm thick polyimide film (trade name: Kapton, produced by Du Pont Toray Co., Ltd.) was treated with plasma. The treated surface was coated with a nickel-chromium alloy by sputtering, thereby forming a seed layer of 65 angstroms thickness. Thereafter, electroplating was carried out in a copper sulfate plating bath, thereby forming an 8 μm thick electrodeposited copper foil layer on the surface of the seed layer. Thus, a double layer flexible substrate was obtained.

The thus obtained double layer flexible substrate was slit into a 35 mm width long tape. According to customary procedure, the surface of electrodeposited copper foil layer thereof was coated with photoresist (trade name: FR-200, produced by Shipley Far East Ltd.), dried, exposed to UV through a glass photomask provided with a 50 μm pitch comb-shaped electrode pattern-of configuration shown in FIG. 6, and developed with alkali (KOH). Thereafter, etching thereof was carried out at 40° C. and at a spray pressure of 2 kg/cm² with the use of an etching line of cupric chloride containing HCl and $H_2O_2$, and the photoresist was stripped off. Thus, a 50 μm pitch comb-shaped electrode pattern shown in FIG. 6 was obtained. Next, the surface of electrodeposited copper foil layer was electroplated with zinc in a zinc electroplating bath (acid ammonium bath, zinc chloride 40 g/l, ammonium chloride 200 g/l, pH adjusted to 5.2–6.2) at 40° C. and at $D_k$ 0.5 A/dm² for 30 sec, thereby forming a zinc plating layer of 150 angstroms thickness so that the region extending across a width of copper wiring from an edge side thereof to the surface of the polyimide film was continuously covered with the zinc plating (see FIG. 4). Thereafter, thermocompression bonding of anisotropic conductive film (trade name: AC-212B-40, produced by Hitachi Chemical Co., Ltd.) was effected thereto, thereby obtaining a circuit board for migration evaluation.

A circuit board for migration evaluation was produced in the same manner as in Example 5 except that in place of the zinc electroplating, electroless tin plating was applied to the surface of electrodeposited copper foil layer. Specifically, a tin plating layer was formed by flash plating conducted at 24° C. for 1 sec in electroless tin plating bath (trade name: LT-34, produced by Shipley Far East Ltd.).

A direct current voltage of 8 V was applied to each of the comb-shaped electrodes obtained in Example 5 and Comparative Example 2, and migration evaluation was performed while maintaining them at 90° C. and 50% RH in constant temperature and humidity chamber (trade name: FX412P type, manufactured by ETAC). The migration evaluation was effected on the basis of insulation resistance calculated every 5 minutes under the voltage load. The changes with time of insulation resistance values are listed in Table 2.

TABLE 2

| Voltage loading time | 0 hr | 250 hr | 800 hr |
|---|---|---|---|
| Example 5 | $2 \times 10^8$ Ω | $9 \times 10^8$ Ω | $1 \times 10^9$ Ω |
| Comp. Ex. 2 | $8 \times 10^8$ Ω | $<10^6$ Ω | $<10^6$ Ω |

It is apparent from Table 2 that the circuit board for migration evaluation of Example 5 having the zinc plating layer superimposed on the surface of electrodeposited copper foil layer retains the insulation resistance even after the passage of 800 hr, maintaining desirable insulation condition.

By contrast, in Comparative Example 2 wherein the tin plating is superimposed on the surface of electrodeposited copper foil layer, the insulation resistance drops at the passage of 250 hr, attesting to the occurrence of migration.

As apparent from these, the superimposing of the zinc coating layer comprising elemental zinc enables extremely prolonging the time to migration occurrence and hence enables obtaining the film carrier tape for mounting electronic components or devices of excellent migration resistance.

What is claimed is:

1. A film carrier tape for mounting electronic components or devices, comprising:
   an insulating film having a treated surface; and
   a wiring composed of a seed layer superimposed on the treated surface of the insulating film and a copper layer superimposed on a surface of the seed layer;
   wherein at least opposed edge side surfaces of the wiring at the treated surface of the insulating film are continuously covered with a zinc coating layer comprising elemental zinc, wherein the zinc coating layer continuously covers the edge side surfaces of the wiring and the treated surface of the insulating film in a vicinity of said edge side surfaces.

2. The film carrier tape for mounting electronic components or devices as claimed in claim 1, wherein the zinc coating layer is one formed by zinc electroplating.

3. The film carrier tape for mounting electronic components or devices as claimed in claim 1, wherein the seed layer comprises nickel.

4. The film carrier tape for mounting electronic components or devices as claimed in claim 1, wherein the seed layer comprises:
- a zinc layer of 10 to 300 angstroms thickness consisting essentially of elemental zinc, superimposed on the treated surface of the insulating film; and
- a nickel base metal layer of 30 to 500 angstroms thickness consisting of a nickel base metal, superimposed on a surface of the zinc layer.

5. The film carrier tape for mounting electronic components or devices as claimed in claim 4, wherein the seed layer is one formed by vapor deposition.

6. The film carrier tape for mounting electronic components or devices as claimed in claim 1, wherein the seed layer comprises an alloy layer superimposed on the treated surface of the insulating film, the alloy layer composed of 70 to 99 mass % of nickel base metal and 1 to 30 mass % of elemental zinc.

7. The film carrier tape for mounting electronic components or devices as claimed in claim 1, wherein the seed layer comprises an alloy layer superimposed on the treated surface of the insulating film, the alloy layer composed of 50 to 95 mass % of elemental nickel, 4 to 20 mass % of elemental chromium and 1 to 30 mass % of elemental zinc.

8. The film carrier tape for mounting electronic components or devices as claimed in claim 7, wherein the seed layer is one formed by vapor deposition.

* * * * *